United States Patent [19]

Merz

[11] Patent Number: 4,535,321

[45] Date of Patent: Aug. 13, 1985

[54] METHOD AND SYSTEM FOR MONITORING FAULTS IN ELECTRICAL CIRCUITS

[76] Inventor: Craig Merz, R.D. 3, Box 224, First St., Califon, N.J. 07830

[21] Appl. No.: 612,551

[22] Filed: May 21, 1984

[51] Int. Cl.³ .................................................. G08B 19/00
[52] U.S. Cl. ..................................... 340/520; 340/501; 340/531; 340/532
[58] Field of Search ............... 340/520, 500, 501, 506, 340/507, 518, 521, 523, 531, 532, 679; 250/200, 561, 562, 208, 209, 215

[56] References Cited

U.S. PATENT DOCUMENTS

| | | | |
|---|---|---|---|
| 3,147,464 | 9/1964 | Spielman | 340/332 |
| 3,872,473 | 3/1975 | Melgaard | 340/520 |
| 3,996,496 | 12/1976 | Volk, Jr. | 317/18 B |
| 4,295,129 | 10/1981 | Cade | 340/520 |
| 4,443,784 | 4/1984 | Franzen et al. | 340/520 |

*Primary Examiner*—Donnie L. Crosland
*Attorney, Agent, or Firm*—Martha G. Pugh

[57] ABSTRACT

A first fault locater system includes a plurality of monitored switches, each connected across a separate electrically isolated input terminal in circuit relation with an optical signaling means which lights up when a fault is detected in the monitored switch. Each signaling device is optically coupled to a separate silicon controlled rectifier which becomes conducting in response to the optical signal. The output from each silicon controlled rectifier is fed through gating circuits to initiate operation of amplifying and reversing means which imposes a negative bias on each silicon controlled rectifier when a first fault is detected. The negative bias serves to disable each of the monitoring circuits except the circuit detecting the first fault, which remains operated, until reset.

6 Claims, 8 Drawing Figures

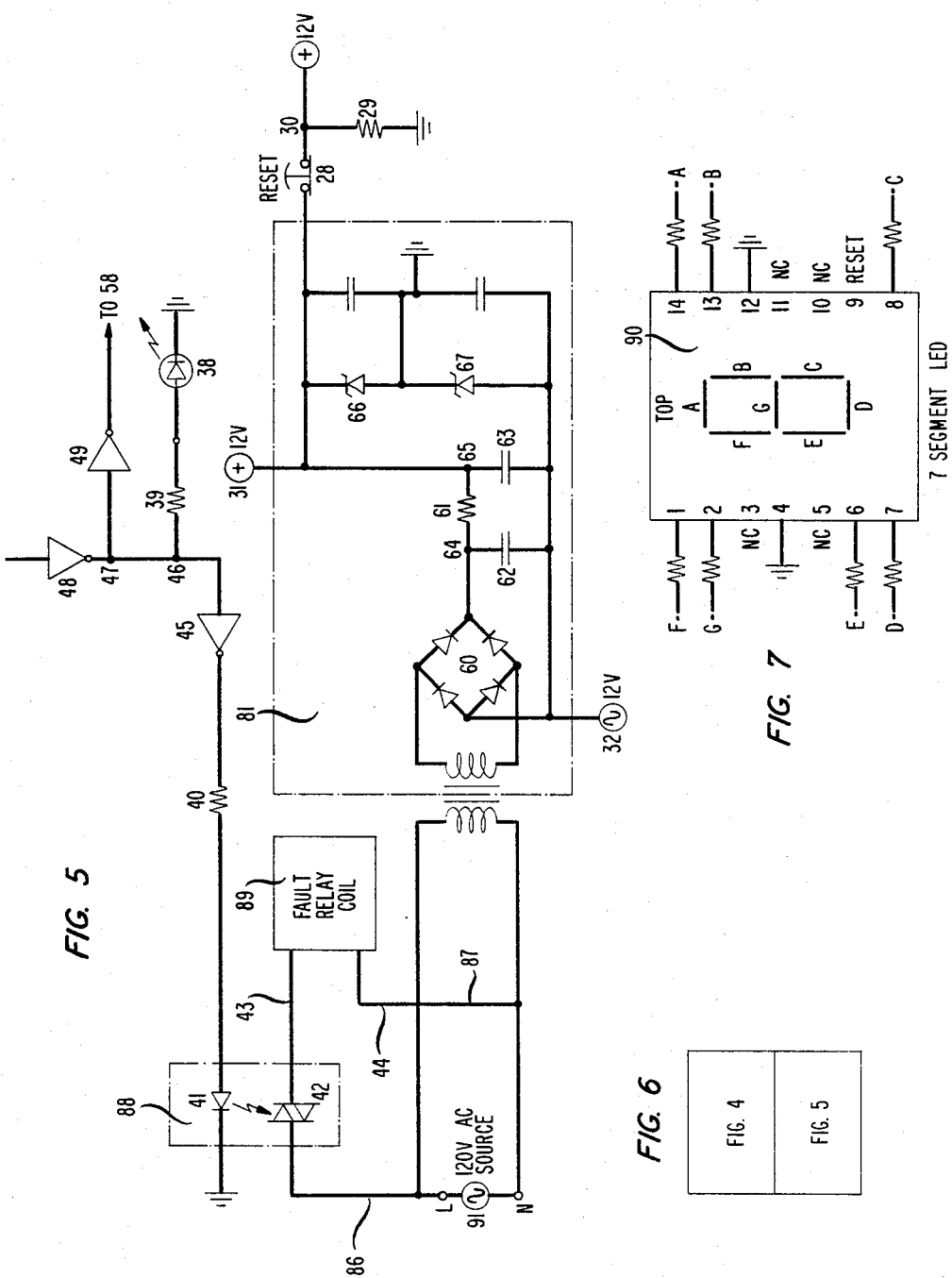

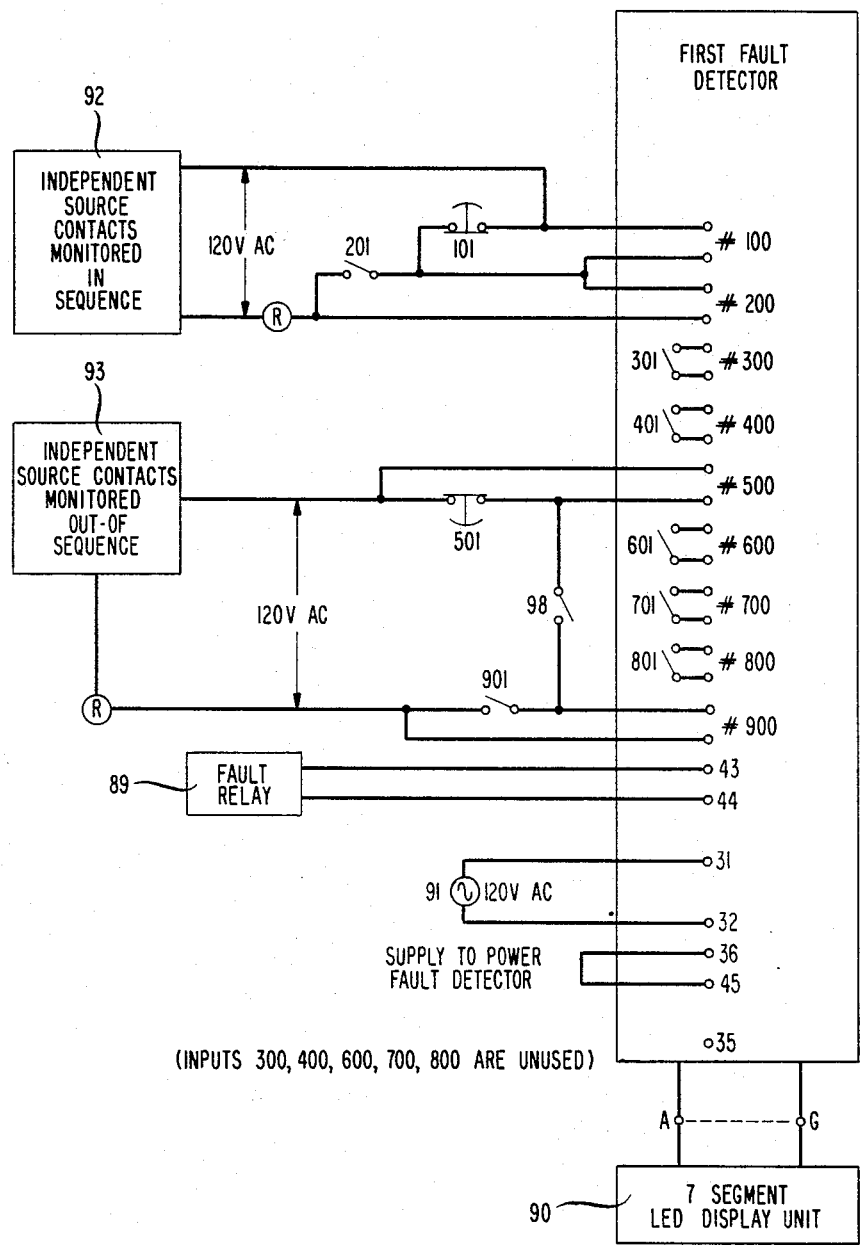

METHOD AND SYSTEM FOR MONITORING FAULTS IN ELECTRICAL CIRCUITS

BACKGROUND OF THE INVENTION

In accordance with the prior art, a detector normally monitors an electrical control circuit so that if one circuit element opens (such as a pressure switch contact indicating high gas pressure) the process, machine, or whatever is controlled by the circuit, will shut-down. Often the first element that shuts the process down may not be known. For example, the gas pressure may have only been too high for a moment, quickly returning to normal, causing the gas switch to close and to operate normally. Thus, the operator may not be apprised of the problem causing shut-down. This has the disadvantages of causing unnecessary shut-downs and in causing unnecessary time and effort in locating the true cause of the shut-down.

In order to eliminate this problem early prior art fault detectors used relays to hold and lock out other fault inputs after detection of the first fault, insuring that only the first fault is displayed. More recent designs use solid state logic for this purpose, such as set-reset elements and "D" type flip-flop circuits.

It is therefore the principal object of this invention to provide an improved first fault detector and monitor which will hold and display the "first fault" to cause shut-down, until the monitor is reset.

More particular objects of the invention are to provide a method or apparatus for detecting a first fault employing a simplified circuit, and at a lower cost.

Assume that there is a series of N switches to be monitored by the "first fault" locator system of the present invention. The N switches to be monitored, may for example, be connected in series operating relation with a single source of power, or they may be energized from separate sources of power. Each monitored switch is connected in shunt across the terminals of a separate, electrically isolated input of the monitoring circuit. Thus, there are N isolated monitoring inputs to correspond to N switches being monitored.

In accordance with the present invention, a triggering optical signal means is connected across each of the isolated input circuits. Each of these triggering means is optically, but not electrically, coupled to a corresponding light responsive device for each circuit which, when optically triggered, becomes conducting at a triggering voltage $V_t$ whenever the triggering optical signal means in the respective circuit lights up indicating a detected fault in its corresponding monitored switch.

When the light responsive device becomes conducting in response to a detected fault, it energizes a display signal device for indicating the fault in the specific circuit, which may take the form of an optical signal means.

At the same time, the output of the conducting light responsive device is impressed on one of a plutality of stacked gating circuits causing an output signal to be generated from the gating circuits which then passes through an amplifying and voltage reversing circuit. The resulting negative voltage signal $V_n$ is impressed on the triggering electrode for each of the light responsive devices. This has the effect of disabling each light responsive device which is not yet conducting, thereby preventing it from being triggered to become conducting in response to an optical signal from its corresponding isolated input circuit. This occurs because the voltage across the light responsive device is less than the triggering voltage $V_t$, which allows it to become conducting. However, the negative biasing voltage $V_n$ is ineffective to shut off the light responsive device in the "first fault" indicator, because the voltage thereacross is greater than $V_c$, the minimum voltage which allows it to remain conducting. Hence, the optical signal device representing the first detected fault continues to stay lighted until a springbiased reset button is depressed to turn it off, cutting off the direct current operating voltage $V_{dc}$ to it and the remaining disabled light responsive device, permitting them to be reset.

In a specific circuit embodiment disclosed by way of illustration, the isolated input circuit connected across each of the switches to be monitored comprises a triggering light-emitting diode in parallel with rectifying means. The triggering light-emitting diode across each separate input is optically coupled (but electrically isolated) with respect to a light responsive device comprising a silicon controlled rectifier, individual to each of the separate monitoring circuit inputs. When the silicon controlled rectifier becomes conducting, it energizes a display light-emitting diode (LED). The anode of the light responsive silicon controlled rectifier in the individual input circuit is also connected to one input terminal of a series of stacked gates, the other input terminals of which are connected in similar relation to the anodes of the light responsive silicon controlled rectifier circuits in each of the remaining input monitoring circuits for each of the N switches to be monitored.

The output of the stacked gating circuits is connected through an inverting amplifier and applied to the gating electrode of the silicon controlled rectifier in each of the monitoring input circuits to impose a disabling bias thereon.

The circuit operates as follows:

Assume that one of the monitored switches opens. This puts the line voltage across the isolated input of the monitoring circuit corresponding to the open switch, causing the triggering light-emitting diode (LED) to light up, and through optical coupling, to turn on the current in the silicon controlled rectifier (SCR). This causes the display LED to light up on the indicator panel, indicating a fault, and at the same time causes a high on one leg to the input of the corresponding NAND gate, causing the output of the stacked gating circuits to go low. The output from the stacked gating circuits is imposed on the input of a reversing amplifier, which functions to impose a negative bias (e.g. −12 volts) on the gating electrode of the silicon controlled rectifiers (SCR) in each of the isolated monitoring circuits. This negative bias serves to lock out and prevent any one of the silicon controlled rectifiers, which has not been conducting, from turning on; but it does not turn off the current in the silicon controlled rectifier in the first fault responsive circuit, whereby that circuit remains operated, and continues to energize the signal display light indicating a first fault, which remains lighted on the front panel indicating in which circuit the first fault has occurred.

Once the fault has been corrected, a reset, spring-biased push button enables the positive twelve volts to be cut off, so that the silicon controlled rectifier in the 'first fault' circuit ceases to conduct, turning off the signal lamp. Simultaneously, the lockout bias is removed from the silicon controlled rectifier in each of the remaining monitoring inputs, thereby setting up the circuit for reoperation.

In a modified embodiment, instead of a display signal lamp to each isolated input, the fault signals are decoded and fed into a single display device, such as a digital indicator.

It will be understood that one or many circuits may be simultaneously monitored using a method and apparatus in accordance with the present invention. Moreover, the monitoring system can be set up so that the monitored circuits may be powered from a single source, or from independent sources; and out-of-service contacts may also be included in those monitored.

Particular features of the first fault locating system of the present invention are that each of the input circuits is electrically isolated; it triggers and holds operated a display device, upon location of a "first fault"; and it locks out other inputs from subsequent fault occurrences.

Particular advantages of the present invention are its simplicity, and the lock-out feature which prevents turn on of all other light-responsive elements in the monitoring input circuits, except the "first fault" locating input, which remains conducting, and which cannot be turned off, except by actuation of the reset push button. Another advantage is that any desired number of inputs may be stacked.

These and other objects, features, and advantages will be better understood from a study of the detailed specification hereinafter with reference to the attached drawings.

SHORT DESCRIPTION OF THE DRAWINGS

Figure 4:
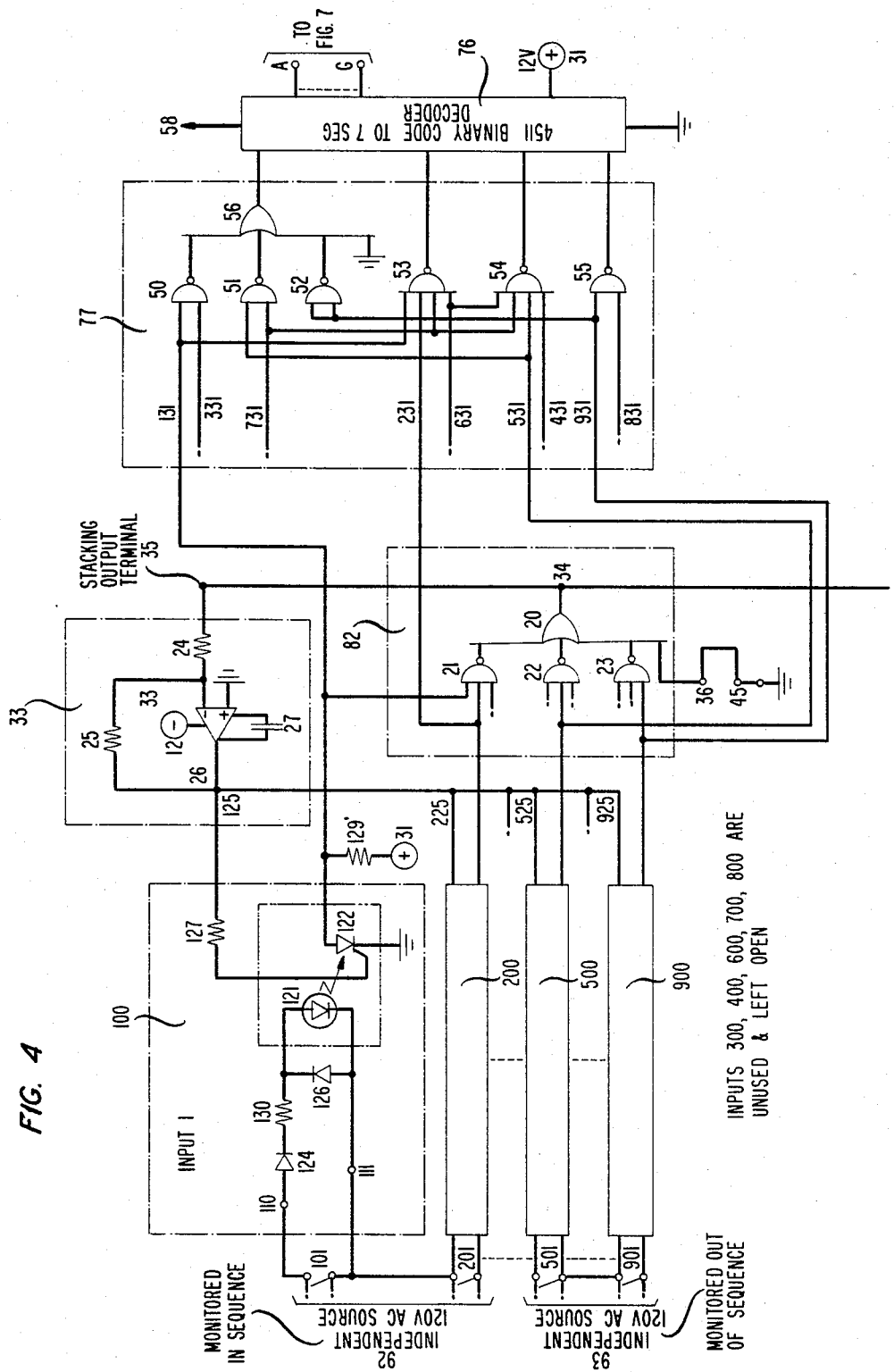

FIGS. 4 and 5, combined as shown in FIG. 6, disclose the circuit schematic for a modified read-out or display model of the system of the present invention.

FIG. 7 shows the video display unit for the combination of FIGS. 4 and 5.

FIG. 8 shows the indicator and terminal layout for the read-out or display model shown in circuit schematic in FIGS. 4 and 5.

DETAILED DESCRIPTION OF THE INVENTION

Figure 1:
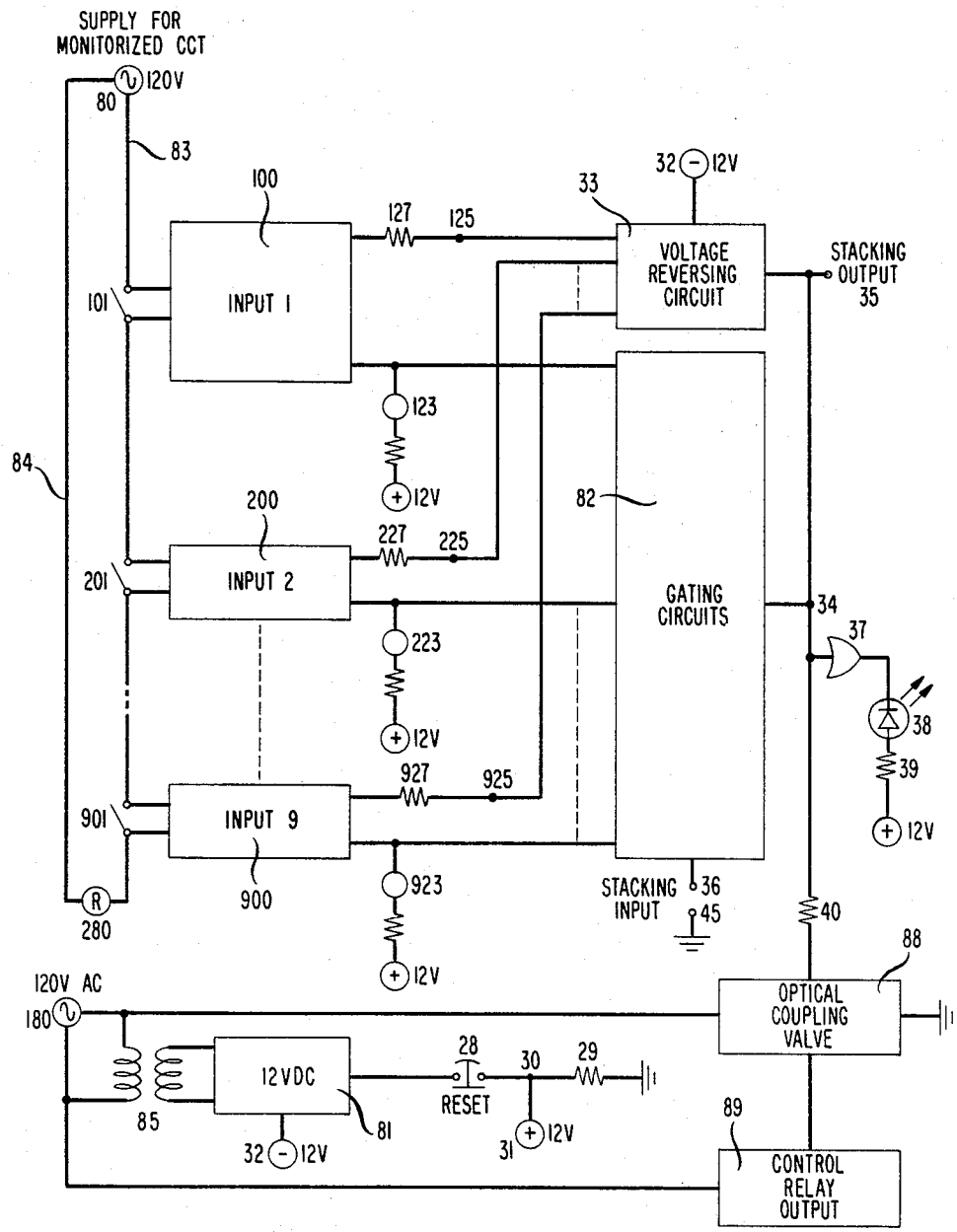
FIG. 1 is a simplified block diagram of the monitoring system of the present invention showing nine isolated inputs in stacked array.

Referring to FIG. 1 of the drawings, assume that a plurality of sensor contacts 101, 201, ---- 901, for monitoring a plurality of items of equipment, are connected in series from a common 120 volt AC supply source 80. These sensoring switches may take the form, for example, of a temperature-responsive switch, a pressureresponsive switch, and so on, each of which is connected to be actuated upon failure of or trouble in the item of equipment being monitored. In such event, it is desirable to determine which equipment item was the first to fail or be in trouble, and to send some type of signal to an annunciator board to indicate which circuit was first out, in order to facilitate repair. A control relay 280 is connected in circuit relation with the monitored circuits 101 ---- 109, and the 120 volt AC source 80.

Figure 2:
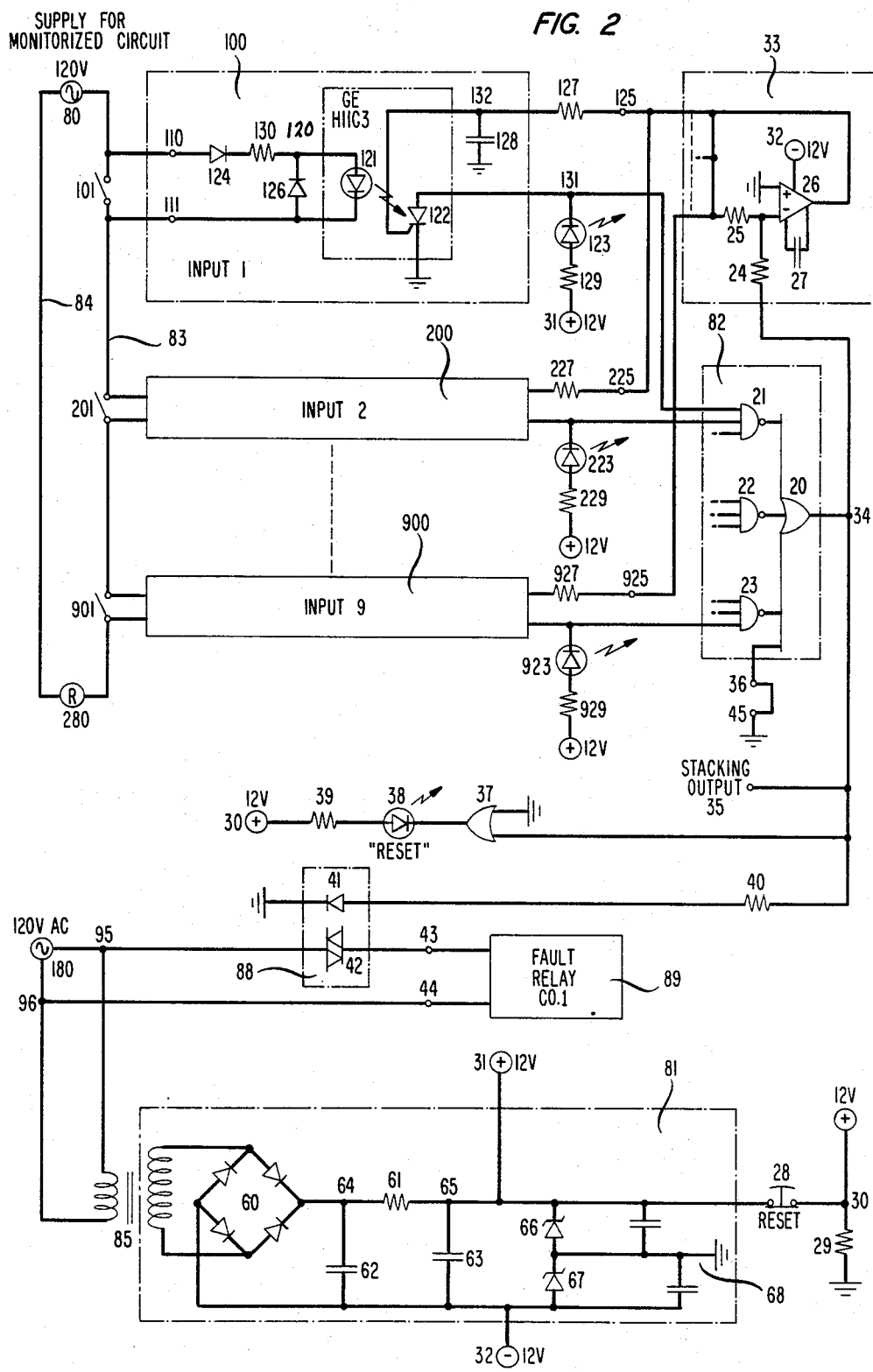
FIG. 2 is a circuit schematic for the basic model of the system of the present invention shown in block diagram in FIG. 1.

In accordance with the present embodiment, across each of the plurality of sensor switches, which may include, in the present illustration, up to, say, nine switches, 101, 201, ---- 901, there is connected a corresponding separate isolated input circuit 100, 200 ---- 900, as indicated in block diagram in FIG. 1, and in detail in FIG. 2.

Each of the isolated input circuits 100, 200 ---- 900, include optical coupling to an indicator circuit which includes a light responsive device whose output is connected in each of the circuits to energize the corresponding light-emitting diode 123, 223, ---- or 923. The outputs from each of the circuits 100, 200, ---- 900, are simultaneously connected through stacked gating circuits 82 to produce an output voltage at 34.

A separate 120 volt AC energizing source 180 is connected across terminals 95 and 96 leading to the primary of step-down transformer 85 to energize the 12 volt DC source 81 which provides the 12 volt positive terminal 31 and the 12 volt negative terminal 32.

The AC source 180 across terminals 95 and 96 is also connected through the leads 43 and 44 under control of optical coupling valve 88 to energize the control relay coil 89 which is set up to actuate a series of contacts to initiate mechanisms to correct a discovered fault.

The output voltage from the stacked gating circuits 82 which appears at junction 34 passes through the resistor 40 to energize the optical coupling 88 to render the line 86 conducting, thereby energizing control relay coil 89.

At the same time, the voltage at output terminal 34 is connected, upon the indication of a "first fault" at one of contacts 101-901, to impress a voltage high on the voltage reversing circuit 33. This produces a negative potential bias at the output of 33, which in the present embodiment is 12 volts.

A particular feature of this invention is that means is provided for locking out each of the monitoring units except the unit detecting the first fault which remains operated, by imposing a negative bias from the reversing circuit 33 in each of units 100-900 through their respective terminals 125-925 connected in series with the respective 100K resistors 127-927.

This feature will now be described in detail with reference to FIG. 2, which shows a system including nine monitoring circuits 100-900 for respectively monitoring contacts 101 to 901 representing nine different circuits. It will be understood that although the present illustrative embodiment is being described with reference to the monitoring of nine circuits, the principles of the present invention are applicable to systems of any number of monitored circuits. To facilitate description, only the isolated input circuit 100 will be described, although circuits 200 through 900 will be understood to be substantially identical to circuit 100, corresponding components being similarly numbered except for the hundreds digit in each case which identify the input circuit to which the element belongs.

Contact 101 of the monitored circuit is connected across terminals 110-111 in series with the output terminal 83 leading to the conventional 120 volt AC source 80. Rectifier 124 is connected in series with the 15K ohm resistor 130 to junction 120. The rectifier 126 is connected between terminal 101 and junction 111 in parallel with a conventional light-emitting diode 121, which serves as a triggering device, which is electrically isolated from, but optically coupled, to the silicon controlled rectifier 122. Light-emitting diode 121 and silicon controlled rectifier 122 may be purchased commercially from General Electric Company as a single unit known as an "SCR optical coupler", designated by their catalogue number GEH11C3.

The silicon controlled rectifier 122 conventionally has three electrodes, a grounded cathode, an anode connected to junction 131, and a gating electrode connected to junction 132.

The latter is connected to ground through the 1000 picofarad capacitor 128, and through the 100K ohm resistor 127 which is connected to terminal 125 at the output of the voltage reversing circuit 33, which is connected to like terminals 225-925 in each of the circuits 100-900.

The junction 131 to the anode of SCR 122 is connected through the conventional display light-emitting diode 123 in series with the 680 ohm resistor 129 to the positive terminal 31 of the 12 volt DC source 81. The display light-emitting diode 123 is equipped with a red lens to provide a red signal light, as are each of the corresponding display light-emitting diodes 223-923 in each of input units 200-900.

Junction 131 is also connected to the gating circuit 82 through one input leg of the NAND gate 21, whose other two input legs are connected to corresponding junctions 231 and 331 in input units 200 and 300. In a similar manner, the three input legs of NAND gate 22 are connected to junctions 431, 531, and 631 in the corresponding input units 400, 500 and 600; and the three input legs of NAND gate 23 are connected to junctions 731, 831 and 931 in the corresponding input units 700, 800 and 900.

The output terminals of each of NAND gates 21, 22 and 23 are connected to the input legs of OR gate 20, whose output leads to junction 34. An additional input leg of OR gate 20 leads to the stacking terminal 36, which may be connected by a jumper to ground terminal 45 unless it is desired to add additional monitoring circuits to the system.

The junction 34 is connected through the 680 ohm resistor 40 in energizing relation to optical coupling light-emitting diode 41 in unit 88, one terminal of which is grounded. Light-emitting diode 41 is optically coupled to silicon thyrister device circuit 42. LED 41 and triac circuit 42 may be purchased commercially as a single optocoupler unit, such as, for example, manufactured by Motorola and indicated in their catalogue as Model No. C3010. Circuit 42 comprises a "triac" thyrister unit in circuit, with line 86 between one terminal of the primary transformer 85 and the input to fault relay 89 to provide 120 volt AC for energizing the relay when optical coupling 88 has been actuated. It is contemplated that the relay coil 89 can be set up in a conventional manner to actuate contacts for initiating the operation of one or more ancillary signaling devices and/or fault correcting mechanisms in response to location of a first fault by the system.

The twelve volt DC circuit 81, which is energized from the secondary of the step-down transformer 85, comprises a conventional rectifier bridge circuit 60, across whose output at junction 64 is connected a filter circuit comprising 100 ohm series resistor 61. This is disposed with its terminals 64 and 65 between the terminals of a pair of parallel connected fixed capacitors 62 and 63 having a range of the order of 330 microfarads 35 volts. Zener diodes 66 and 67, each in parallel with a 0.22 microfarad capacitor, are respectively connected between the +12 volt positive terminal 31 and ground 68, and the −12 volt negative terminals 32 and ground 68. The 12 volt positive terminal 31 is connected through the spring-biased reset button 28 to junction 30, which is connected to ground through the 10K ohm resistor 29.

The output junction 34 leading from the gating circuits in 82 is connected to the "Reset" indicator circuit, through the input leg of OR gate 37, the other leg of which is grounded. The output of gate 37 is connected through light-emitting diode 38 (having a green lens) and the 680 ohm resistor 39 to the terminal 30, which provides 12 volts positive after reset button 28 has been actuated.

The junction 34 at the output of the gating circuits 82 is also connected to the stacking output terminal 35, and to the input of the voltage reversing and amplifying circuit 33 through the 10K ohm resistor 24. Circuit 33, in the present illustration, comprises a voltage reversing amplifier 26 designated by National Semiconductor as type LM-301 designated in their catalogue entitled LINEAR DATABOOK. Amplifier 26 is set up as an inverting operational amplifier. A 30 picofarad capacitor 27 is connected between input and output of the amplifier, and a 100K resistor 25 is also connected between the input and output terminals. Through the latter, a negative bias voltage, which comprises a −12 volts, may be imposed on each of the terminals 125-925 in each of the circuits 100-900 which provides a lockout voltage on the gating electrode of the silicon controlled rectifiers 122-922.

Referring to the operation of the circuit of FIG. 2, assume that the monitored contact 101 opens across the isolated input 100. This imposes a voltage across the triggering light-emitting diode 121, causing the same to light up, turning on the silicon controlled rectifier 122, to which it is optically coupled. The latter energizes the display light-emitting diode 123, causing it to light up to indicate a "fault" in contact 101.

Simultaneously, the NAND gate 21, whose output was initially low, at zero volts, is caused to go to a high of 12 volts positive. This causes the output of the OR gate 20, which was initially low, to become high, and to impose an input voltage on inverting amplifier 26, thereby causing it to produce a negative bias output of −12 volts.

This imposes 12 volts negative on the silicon controlled rectifier circuits (SCR'S) 122-922 in each of the monitoring circuit 100-900, through each of the corresponding 100K ohm resistors 127-927, including the SCR 122 in the "first fault" detecting circuit 100. This operation has the effect of "locking-out" the silicon controlled rectifiers 222-922 in each of the circuits 200 through 900, but not in circuit 100, in which the SCR 122 remains conducting, the corresponding display lightemitting diode 123 remaining lighted in that circuit, to indicate the first fault.

Simultaneously, the optical coupling 88 is actuated, causing the fault relay coil 89 to be energized to operate relay contacts to initiate mechanisms to correct the fault. Once the fault is located and removed, all of the circuits can be simultaneously reset by pushing the spring-loaded "reset" push button 28 which temporarily disconnects ground from the 12 volt positive terminal 31 leading to each of the LED indicator lights 123-923, and to the reversing amplifier 26, thereby removing the negative 12 volt bias from the silicon controlled rectifier in each of the circuits 100-900, conditioning the composite circuit for reoperation.

Figure 3:
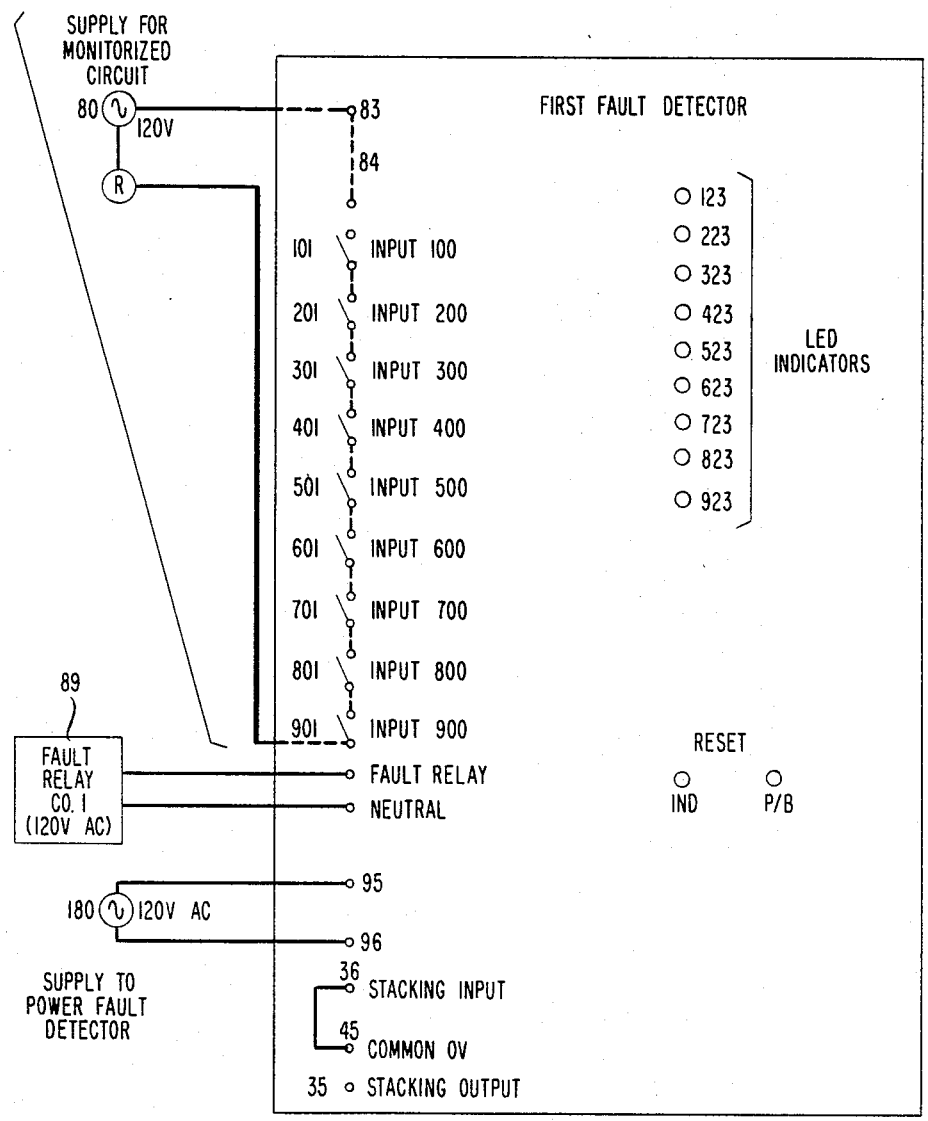
FIG. 3 shows the indicator and terminal layout for the basic model shown in circuit schematic in FIG. 2.

Referring to FIG. 3, there is shown the control panel corresponding to the circuit schematic of FIG. 2. This includes the 120 volt AC source 180 which is connected across the terminals 95 and 96 which serves as a source of power for energizing the fault detector of the present invention, as shown in FIGS. 1 and 2. This also indicates the terminals 83 and 84 across which are connected the 120 volt AC source 80, which services as the power supply for the monitored circuit. The nine pairs of terminals 110, 111, 210, 211; ---- 900, 911, are respectively connected in series by sensitized contacts 101, 201, ---901, of the circuits to be monitored. The LED indicator lights 123, 223, ---- 923, corresponding to each of the isolated monitoring inputs, 100-900, are mounted in a column to light up for indicating a first fault.

A jumper is ordinarily connected between stacking output 36 and the grounded common output terminal 45, unless it is desired to add additional monitoring inputs, in which case, terminals 36, for the stacking input, and terminal 35, for the stacking output, are available.

Referring to the circuit schematic of FIG. 4, there is shown a modification of the system of the present invention which takes the form of a "read-out" or display mode.

As in the system described with reference to FIG. 2, each of the input units are powered from a 120 volt AC source which may either be a single source, such as 80, shown in FIG. 2, or several independent sources, such as 92 and 93, connected as will be described in greater detail with reference to FIG. 17, which shows the control panel for this system. In the present system, for the purposes of illustration, only the monitoring units 100, 200, 500, and 900 are connected to monitor the contacts in several independent sources, as will be described. For the present description, units 300, 400, 600, 700 and 800 are deemed to be disconnected, although it will be understood that they, too, are adapted for monitoring use on additional circuits, if desired.

In the circuit under description the 12 volt DC power supply 81, the stacked gating circuits 82, and voltage amplifying and reversing circuit 33, as well as isolated inputs 100, 200, 500 and 900, are substantially similar to those described with reference to FIG. 2 and will not be re-described. Furthermore, any components assigned the same designating numbers as shown in the circuit of FIG. 2, may be assumed to be substantially similar to those previously described.

In the system described with reference to FIG. 4, instead of having the individual signal indicators, 123-923 for each of the isolated inputs, the present embodiment features a single video display unit 90.

The output 131 from the light-responsive silicon controlled rectifier 122 in input circuit 100 is connected directly to the energizing 12 volt positive source 31 through the 680 ohm resistor 129', the display light-emitting diode having been eliminated. Instead, junction 131 in input circuit 100, and corresponding junctions 231-931 in input circuits 200-900, are connected through the stacked gating circuit 77 and the binary code to the seven segment decoder 58 whose outputs are connected to the video display circuit 90.

The connections from each of the read-out terminals 131-931 in input circuits 100, 200, 500 and 900 to the stacked gating circuits in 77 are as follows:
 131 to a first input leg of NAND gate 50;
 331 to a second input leg of NAND gate 50 and a first input leg of NAND gate 53;
 531 to a first input leg of NAND gate 51 and a third input leg of NAND gate 54;
 231 to a second input leg of NAND gate 53;
 631 to a first input leg of NAND gate 54 and a fourth input leg of NAND gate 53;
 731 to a second input leg of NAND gate 51, a third input leg of NAND gate 53, and a second input leg of NAND gate 54;
 451 to a fourth input leg of NAND gate 54;
 931 to a first input leg of NAND gate 55, and first and second input legs to NAND gate 52; and
 831 to a second input leg of NAND gate 55.

The outputs of each of NAND gates 50, 51 and 52 are fed into OR gate 56, one of whose input terminals is grounded.

The outputs of OR gate 56 and NAND gates 53, 54, and 55 are fed in the binary code to seven segment decoder 76, where the information is converted from binary to digital, appearing on the output terminals A, B, C, D, E, F and G.

The decoder 76 is of a type which is sold commercially as Model No. 4511 by RCA and is characterized by BCP to seven segment display converter, and is identified in their catalogue designated "CMOS LOGIC", dated 1982.

Referring to FIG. 5, the outputs from each of terminals A, B, C, D, E, F and G of decoder 76 are fed into the terminals of LED display unit 90 through a 680 ohm resistor, in each case, in the following relation:
 F to terminal 1
 G to terminal 2
 E to terminal 6
 D to terminal 7
 A to terminal 14
 B to terminal 13
 C to terminal 8

Terminals 4 and 12 are grounded; terminal 9 is connected to reset terminal 30 (FIG. 4); and terminals 3, 4, 5, 10 and 11 of unit 90 are not connected.

The display unit 90, in the present embodiment is a seven segment light-emitting diode (LED) which may be obtained from Radio Shack as their Model 276-075.

Decoder 76 is energized from the positive 12 volt source 31 through a connection to the DC source 81.

The function of terminal 58 of decoder 76 is to disable decoder 76 in a reset condition. The circuit leading from output terminal 34 of gating circuit 82 to terminal 58 passes through the buffering amplifiers 48 and 49. In addition, the signal from buffering amplifier 48 passes through junctions 47, and 46 and through reverse amplifier 45, and the 680 ohm resistor 40 to energize the optical-coupler 88, and thereby to energize the fault relay coil 89 connected across terminals 43 and 44 to 120 volt AC source 91. At the same time, the light-emitting diode 38 is de-energized through resistor 39 from junction 46. LED 38 is used to indicate a "reset" or no fault condition.

As previously described with reference to the circuit of FIG. 2, amplifier 26 is connected to impose 12 volts negative on junction 125 in input circuit 100, and on the corresponding junctions 225, 525 and 925 in the other operating input circuits 200, 500 and 900 to negatively bias the corresponding silicon controlled rectifiers 122, 222, 522, and 922 in each of the circuits, as previously described with reference to FIG. 2.

Referring to FIG. 7, which shows the control panel for a circuit of the type described with reference to FIG. 4, utilizing two independent sources of power at 120 volts AC, namely, 92 and 93. Source 92 is connected to service, in sequence, contacts 101' and 201' across the input terminals of circuits 100 and 200, respectively. Source 93 is connected to service, out of sequence, contact 501', connected across the input terminals of circuit 500, and contact 901', is connected across the input terminal of circuit 900, when switch 98 is closed. The remaining contacts 301, 401, 601, 701 and 801, are unoperated.

Although the present invention has been described with reference to particular circuit combinations and circuit elements, by way of illustration, it will be understood that the present invention is not limited to the particular combinations shown and described, but only by the scope of the appended claims.

What is claimed is:

1. A monitoring circuit for detecting and indicating the first of a series of faults in one or more electrical systems comprising a plurality of N switches connected to a source of power which comprises in combination:

a series of N isolated input circuits each connected across a corresponding one of said switches, and each said isolated input circuits including a triggering optical signal means for producing an optical signal in response to disconnect of one of said switches;

an optical responsive device corresponding to, and optically, but not electrically, coupled to each of said triggering optical signal means, each said optical responsive device having means responsive to a signal from said triggering optical signal means to impose a threshold voltage $V_t$ across said optical responsive device, at which voltage said optical responsive device becomes conducting, said device being constructed and arranged once it has been rendered conducting to remain conducting even when the voltage across said device falls below the threshold voltage $V_t$ to a lower voltage $V_c$;

display optical signal means connected in energy transfer relation to each said optical responsive device, and constructed and arranged to produce an optical signal as long as said optical responsive device remains conducting;

the outputs of said optical responsive devices connected in cascaded arrangement with a succession of stacked gating devices constructed and arranged to produce an output signal whenever at least one of said optical responsive devices becomes conducting;

lock-out means connected to receive an output signal from said cascaded gating circuits and in response to said received signal to impose a negative voltage $-V_n$ across each of said optical responsive devices, thereby to negatively bias each said optical responsive device to maintain a voltage $V_l$ across each said optical responsive device in response to a signal received from said triggering optical signal means in any of said isolated input circuits, wherein $V_l$ is below $V_t$ but above a voltage $V_c$, whereby only the optical responsive device which is initially conducting after receiving the first said optical signal, remains conducting, and the other optical responsive devices are disabled from becoming conducting in response to subsequent received signals.

2. The combination in accordance with claim 1 wherein said triggering optical signal means and said display optical signal means comprise light-emitting diodes ("LEDS"), and wherein said optical responsive devices comprise silicon controlled rectifiers (SCR'S).

3. The combination in accordance with claim 1 which includes reset means connected to said disabling means for simultaneously de-energizing whichever of said optical responsive devices is conducting, and removing the disabling voltage from the triggering means of each of said other optical responsive devices.

4. The combination in accordance with claim 2 wherein direct current energizing means is provided for maintaining a voltage $V_{dc}$ across each of said silicon controlled rectifiers, whereby in response to an optical signal from said triggering light-emitting diode, the voltage across said silicon controlled rectifier is raised to $V_t$, causing said silicon controlled rectifier to become conducting; and wherein in response to application of a negative voltage $(-V_n)$ to each of said silicon controlled rectifiers, the voltage thereacross is reduced to $V_t-V_n$, which, in response to an optical signal from said triggering light-emitting diode is less than $V_t$, but greater than $V_c$.

5. The combination in accordance with claim 1 wherein said display optical signal means comprises a single digital display device which is connected in energy transfer relation to receive output signals from each of said optical responsive devices.

6. The combination in accordance with claim 1 which includes relay means constructed and arranged to be energized by said optical responsive means to open or close contacts to initiate one or more fault signaling and fault correction mechanisms.

* * * * *